(12) United States Patent
Birkner et al.

(10) Patent No.: US 10,003,338 B2
(45) Date of Patent: Jun. 19, 2018

(54) PROGRAMMABLE ANALOG AND DIGITAL INPUT/OUTPUT FOR POWER APPLICATION

(71) Applicant: AnDAPT, Inc., San Jose, CA (US)

(72) Inventors: John Birkner, Woodside, CA (US);
Kapil Shankar, Saratoga, CA (US);
Herman Cheung, Cupertino, CA (US);
Patrick J. Crotty, San Jose, CA (US);
Ranajit Ghoman, San Carlos, CA (US)

(73) Assignee: AnDAPT, INC., San Jose, CA (US)

( * ) Notice: Subject to any disclaimer, the term of this patent is extended or adjusted under 35 U.S.C. 154(b) by 0 days. days.

(21) Appl. No.: 15/656,965

(22) Filed: Jul. 21, 2017

(65) Prior Publication Data
US 2018/0026636 A1 Jan. 25, 2018

Related U.S. Application Data

(60) Provisional application No. 62/365,330, filed on Jul. 21, 2016.

(51) Int. Cl.
*H03K 19/177* (2006.01)
*H03K 19/0175* (2006.01)
*H03K 5/24* (2006.01)
*H03K 19/00* (2006.01)

(52) U.S. Cl.
CPC ....... *H03K 19/017581* (2013.01); *H03K 5/24* (2013.01); *H03K 19/017509* (2013.01); *H03K 19/0016* (2013.01)

(58) Field of Classification Search
CPC ............. H03K 5/24; H03K 19/017509; H03K 19/0016
USPC ...................................................... 326/38, 39
See application file for complete search history.

(56) References Cited

U.S. PATENT DOCUMENTS

| | | | | | |
|---|---|---|---|---|---|
| 5,563,526 | A | * | 10/1996 | Hastings | H03F 3/72 326/37 |
| 5,877,718 | A | * | 3/1999 | Andoh | H03M 1/0682 341/155 |
| 5,959,466 | A | * | 9/1999 | McGowan | H03K 19/17788 326/39 |
| 6,462,621 | B1 | * | 10/2002 | Charles | H03G 3/001 330/282 |
| 7,436,207 | B2 | * | 10/2008 | Rogers | G06F 13/4022 326/37 |

(Continued)

*Primary Examiner* — Don Le
(74) *Attorney, Agent, or Firm* — Innovation Counsel, LLP

(57) ABSTRACT

A threshold comparator block integrated in a programmable logic device (PLD) is disclosed. The threshold comparator block includes: one or more signal comparators configured to receive two analog input signals and provide a digital output signal indicating a comparison result of the two analog input signals; an analog output driver configured to interface with an analog fabric of a programmable fabric of the PLD; a digital input/output (I/O) driver configured to interface with a digital fabric of the programmable fabric of the PLD; and I/O pins configured to provide an interface with a signal wrapper to interface analog and digital signals between the analog output driver and the digital I/O driver and the programmable fabric. The threshold comparator block is configured to interface with one or more adaptive blocks integrated in the PLD via the programmable fabric and the signal wrapper.

11 Claims, 14 Drawing Sheets

(56) References Cited

U.S. PATENT DOCUMENTS

| | | | |
|---|---|---|---|
| 7,825,688 B1* | 11/2010 | Snyder | G06F 1/08 |
| | | | 326/39 |
| 9,473,144 B1* | 10/2016 | Thiagarajan | H03K 19/17736 |
| 2005/0242836 A1* | 11/2005 | Goetting | G01R 31/3167 |
| | | | 326/39 |
| 2013/0207824 A1* | 8/2013 | Waters | H03M 1/12 |
| | | | 341/155 |
| 2014/0139365 A1* | 5/2014 | Vun | G06F 7/729 |
| | | | 341/155 |
| 2017/0242534 A1* | 8/2017 | Gray | G06F 3/0416 |

* cited by examiner

PROGRAMMABLE ANALOG AND DIGITAL INPUT/OUTPUT FOR POWER APPLICATION

CROSS-REFERENCE TO RELATED APPLICATION(S)

This application claims the benefits of and priority to U.S. Provisional Patent Application Ser. No. 62/365,330 filed Jul. 21, 2016, the disclosure of which is incorporated herein by reference in their entirety.

TECHNICAL FIELD

The present disclosure relates generally to programmable logic devices (PLDs), more particularly, to a programmable threshold comparator block integrated in a PLD.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

A threshold comparator block integrated in a programmable logic device (PLD) is disclosed. The threshold comparator block includes: one or more signal comparators configured to receive two analog input signals and provide a digital output signal indicating a comparison result of the two analog input signals; an analog output driver configured to interface with an analog fabric of a programmable fabric of the PLD; a digital input/output (I/O) driver configured to interface with a digital fabric of the programmable fabric of the PLD; and I/O pins configured to provide an interface with a signal wrapper to interface analog and digital signals between the analog output driver and the digital I/O driver and the programmable fabric. The threshold comparator block is configured to interface with one or more adaptive blocks integrated in the PLD via the programmable fabric and the signal wrapper.

According to another embodiment, a programmable logic device (PLD) includes: a threshold comparator block; a programmable fabric; and a signal wrapper configured to provide signals between the threshold comparator block and the programmable fabric. The threshold comparator block includes: one or more signal comparators configured to receive two analog input signals and provide a digital output signal indicating a comparison result of the two analog input signals; an analog output driver configured to interface with an analog fabric of the programmable fabric; a digital input/output (I/O) driver configured to interface with a digital fabric of the programmable fabric; and I/O pins configured to provide an interface with the signal wrapper to interface analog and digital signals between the analog output driver and the digital I/O driver and the programmable fabric. The threshold comparator block is configured to interface with one or more adaptive blocks integrated in the PLD via the programmable fabric and the signal wrapper.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

Figure 1:
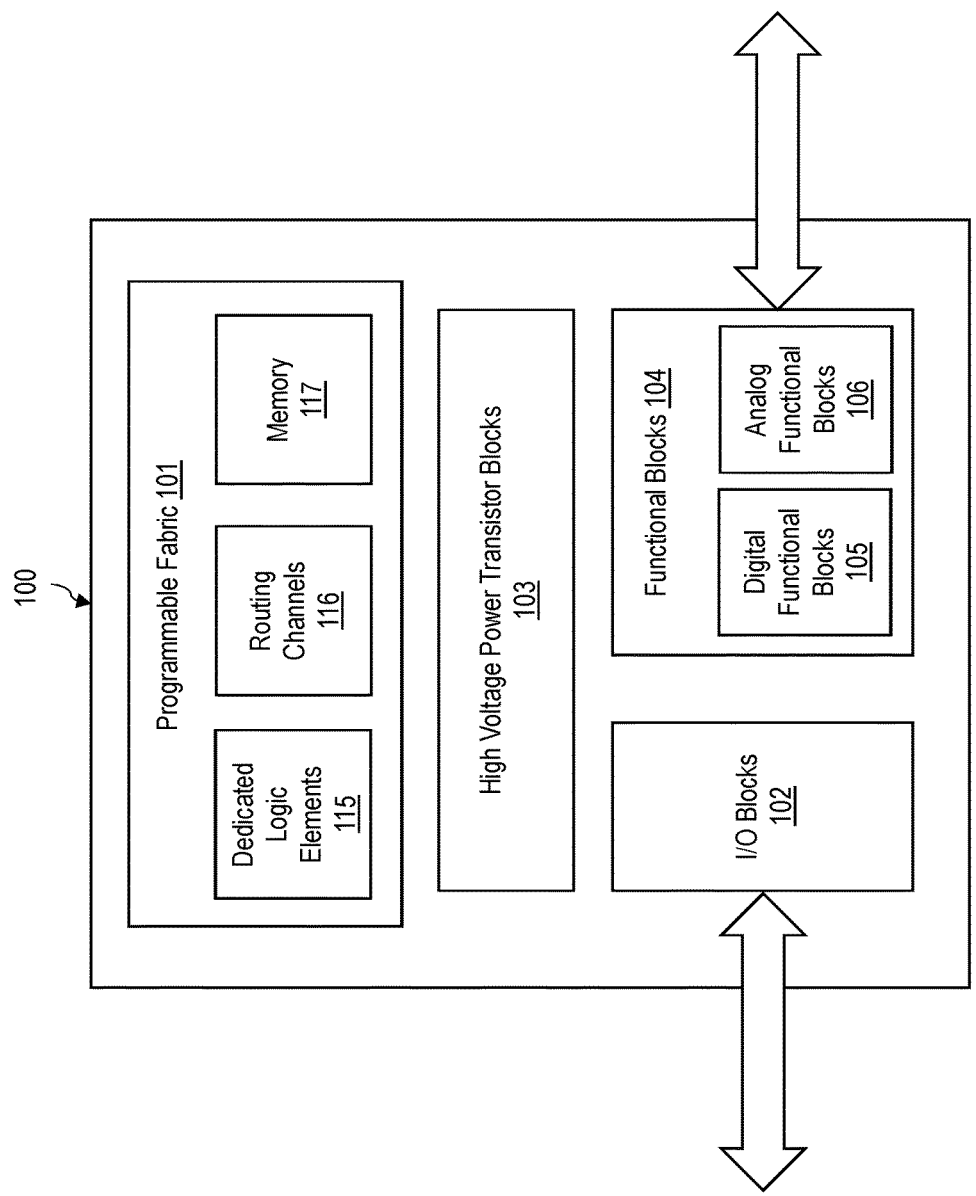
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a scalable metal-oxide-semiconductor field-effect transistor (MOSFET) block integrated in a PLD. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to a threshold comparator block integrated in a PLD. The threshold comparator block can interface with the programmable fabric of the PLD and other blocks integrated in the PLD using a corresponding signal wrapper. The threshold comparator can further interface with other adaptive blocks integrated in the PLD via the programmable logic. Examples of other blocks integrated in the PLD include, but are not limited to, one or more adaptive differential digitizer (ADi), one or more scalable integrated MOSFET (SIM) blocks, one or more noise-immune reference (Nref) blocks.

The present PLD can provide a power management platform for high-voltage and high-power applications such as power management, power convertors, industrial control, automobile, etc. using one or more integrated power blocks. The present PLD can be used to integrate dissimilar rails on a single chip.

The PLD can be configured as various types of regulators, switches, muxes, battery chargers, switching controllers, gate drivers, etc. Example configurations of the PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target application, the PLD can be programmed to function as an integrator combining one or more of a buck regulator (either current or voltage mode), a boost regulator, a buck-boost regulator, a low drop-out (LDO) regulator, a load switch, a mux, a battery charger, an external switching controller, and a gate driver. The PLD can also be programmed to function as a pulse width modulator (PWM) for providing constant current (CC) in a current mode or a constant voltage (CV) in a voltage mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

FIG. 1 shows a block diagram an example programmable logic device (PLD), according to one embodiment. The PLD 100 includes a programmable fabric 101, one or more I/O blocks 102, one or more high voltage power FET blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power FET blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power FET blocks, for example, four, eight, and twelve depending on a size of the chip and requirement for an intended application. The high voltage power FET blocks 103, herein also referred to as scalable integrated MOSFET (SIM) blocks, can be configured and programmed to be a constituent block or element of a more complex circuit or device. In one embodiment, the high voltage power FET blocks 103 can support voltages ranging from 12V to 80V and current up to 12 A. The voltage and current limits that the high voltage power FET blocks 103 can support may vary depending on an intended power application and the process technology used for manufacturing the PLD 100. According to one embodiment, the high voltage power FET blocks 103 can integrate both n-channel and p-channel FETs.

According to one embodiment, the source and the drain of each the high voltage power FETs in the high voltage power FET blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power FETs. The presence of one or more high voltage power FETs on the same chip can provide flexible configurations of the PLD 100 by programming the programmable fabric 101. For example, different high voltage power FETs on the same chip can connect to different external power rails or sensor hubs. In another example, the high voltage power FETs can be externally connected in series via the source and the drain of the high voltage power FETs. The programmable fabric 101 can be programmed to connect the I/O blocks 102, the high voltage power FET blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power FET blocks 103, and the digital functional blocks 105. For example, the digital fabric can provide a power path and the connectivity among the integrated analog blocks, digital logic elements, timers, I/Os, etc. The analog fabric corresponds to a portion of the programmable fabric 101 to provide analog interfaces with one or more external telemetry and sensor blocks, an I2C interface, an SPI interface, etc.

According to one embodiment, a high voltage power FET implemented in the high voltage power FET blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target application.

The present PLD includes one or more analog functional blocks that are adaptive for providing various user-configurable analog functions. The adaptive analog blocks are wrapped with respective signal wrappers on the programmable fabric. The programmable fabric provides a programmable environment to build user-configurable custom analog functions by digitally or combining one or more adaptive analog blocks by selectively and programmably interconnecting and combining the signal wrappers that provide interface to the adaptive analog blocks. The signal wrappers of the adaptive analog blocks eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with signal wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The signal wrapper of the present adaptive platform can provide a digital PID control to various analog actuators including, but not limited to, DC motors, servo motors, stepper motors, motion control, breakers, fan controllers.

Figure 2A:
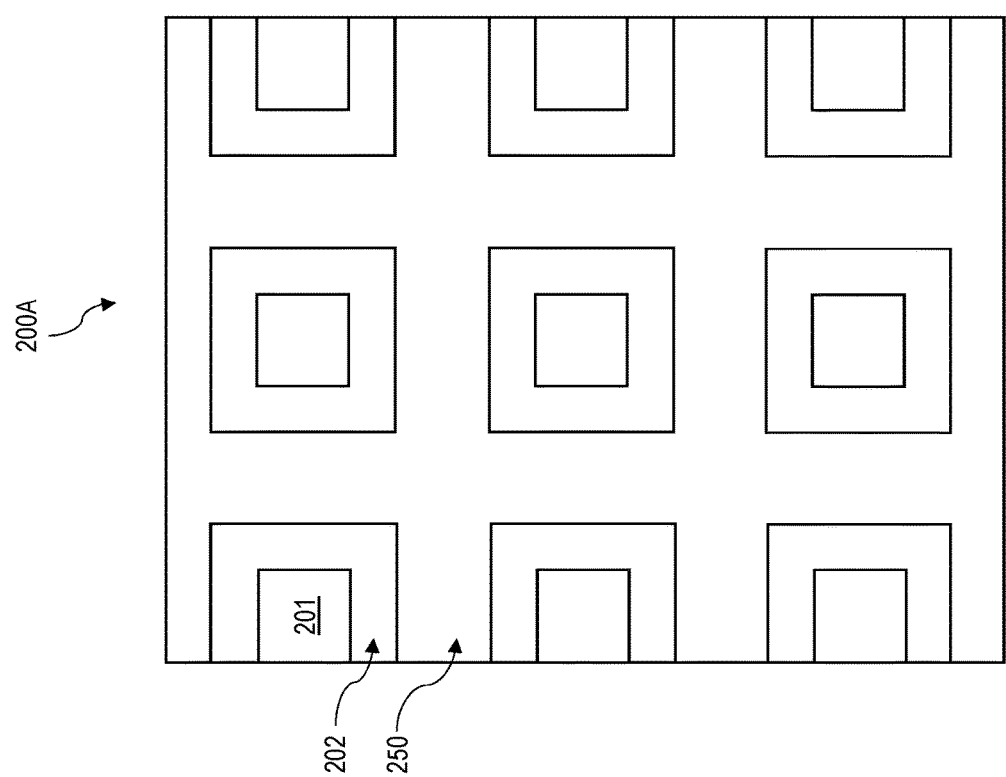
FIG. 2A illustrates a schematic block diagram of an analog and digital adaptive platform, according to one embodiment.

FIG. 2A illustrates a schematic block diagram of an analog and digital adaptive platform, according to one embodiment. The analog and digital adaptive platform 200A includes a plurality of analog and digital adaptive blocks 201 interconnected with signal wrappers 202 on a programmable fabric 250. Referring to FIG. 1, the adaptive blocks 201 correspond to any of the high voltage power FET blocks 103, the digital functional blocks 105, and the analog functional blocks 106. Each of the adaptive blocks 201 arranged on the programmable fabric 250 is user-configurable and programmable by the coupled signal wrapper 202 to provide a user-configurable function for a target application or one or more circuit components of a target application.

A signal wrapper 202 provides an interface circuitry required for the coupled adaptive block 201 to interconnect with another adaptive block 201 and/or an I/O block (e.g., I/O block 102 of FIG. 1) via the programmable fabric 250. According to one embodiment, the analog and digital adaptive platform 200A includes a predetermined number of adaptive blocks 201. Examples of the adaptive blocks 201 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 201 can be programmably configured to build a variety of analog circuitry for various applications via the programmable fabric 250.

According to one embodiment, a signal wrapper 202 can include both a digital wrapper for providing interfaces for digital signals and an analog wrapper for providing interfaces for analog signals to the corresponding adaptive blocks 201. The programmable fabric 250 can include a digital fabric and an analog fabric. In this case, the digital wrapper of the signal wrapper 202 interfaces with the digital fabric of the programmable fabric 250, and the analog wrapper of the signal wrapper 202 interfaces with the analog fabric of the programmable fabric 250.

According to one embodiment, each of the adaptive blocks 201 or a combination of multiple adaptive blocks 201 is programmed over the programmable fabric 250 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 201 or a combination of multiple adaptive blocks 201 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 201 and one or more of functional blocks (e.g., the functional blocks 104 of FIG. 1) and I/O blocks (e.g., the I/O blocks 102 of FIG. 1), the signal wrappers 202 of the analog and digital adaptive platform 200A can provide a digital proportional-integral-derivative (PID) control to various analog actuators including, but not limited to, a DC motor, a servo motor, a stepper motor, a motion control, breakers, and a fan controller.

Figure 2B:
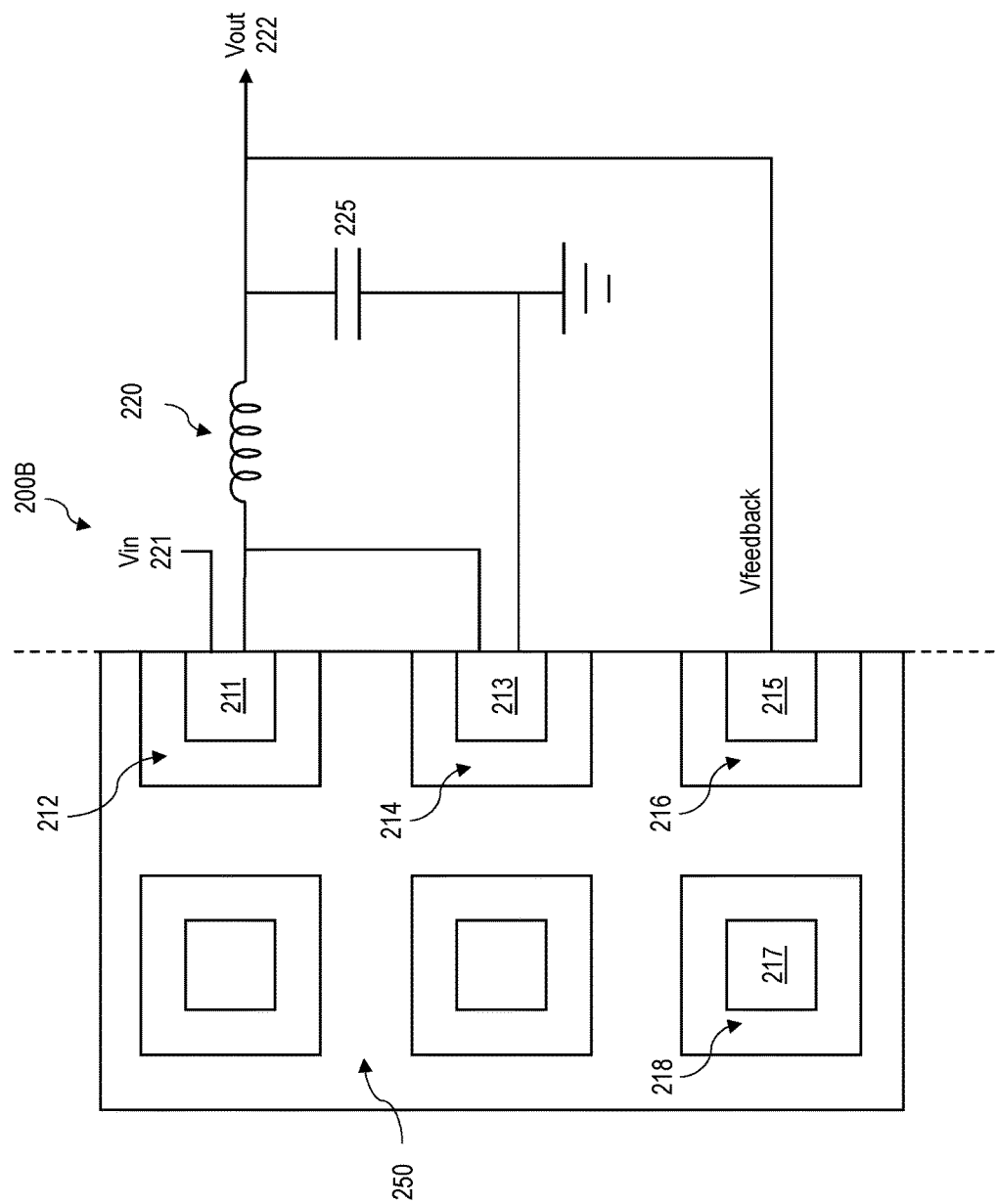
FIG. 2B illustrates an example of the analog and digital adaptive platform of FIG. 2A configured as a hysteretic mode buck switching converter, according to one embodiment.

FIG. 2B illustrates an example of the analog and digital adaptive platform of FIG. 2A configured as a hysteretic mode buck switching converter, according to one embodiment. The hysteretic mode buck switching converter 200B may also be referred to as a bang-bang buck switching converter. The hysteretic mode buck switching converter 200B is a DC-to-DC step-down power converter that converts an input voltage Vin 221 to an output voltage Vout 222 that is lower than the input voltage. The output current may be stepped up while the input voltage is stepped down. The hysteretic mode buck switching converter 200B can provide an efficient power conversion compared to a linear regulator that lowers the input voltage by dissipating power as heat without stepping up the output current.

The analog and digital adaptive platform 200B can be an example of the analog and digital adaptive platform 200A shown in FIG. 2A. For example, the adaptive blocks 211, 213, 215 and 217 are instances of the adaptive blocks 201 of FIG. 2A, the signal wrappers 212, 214, 216, and 218 are instances of the signal wrapper 202 of FIG. 2A. Each of the adaptive blocks 211, 213, 215 and 217 can be one of a comparator block, a memory block, a PWM block, a voltage reference block, and a timer block.

In the present example, the adaptive block 215 is a comparator block. According to one embodiment, the comparator block is included in the analog functional blocks 106 of FIG. 1. The adaptive blocks 211 and 213 drive a filter including an inductor 220 and a capacitor 225 in a synchronous mode. The feedback voltage, $V_{feedback}$, of the filter output 222 (e.g., 1.0V, 4 A) is connected to the comparator block 215. Various internal connections and routing channels are configured to interconnect the adaptive blocks 211, 213, 215 and 217. For example, the adaptive block 217 and the adaptive block 215 are interconnected using the signal wrapper 218 that provides a digital interface to the adaptive block 217, and the signal wrapper 216 that provides a digital interface to the adaptive block 215 via the programmable fabric 250. In a similar fashion, the adaptive block 217 and the adaptive block 213 can be interconnected with the signal wrapper 218 and signal wrapper 214, and the adaptive block 217 and the adaptive block 211 can be interconnected with the signal wrapper 218 and the signal wrapper 212 via the programmable fabric 250. In this example, the adaptive blocks 211, 213, 215 and 217 are configured as a hysteretic mode buck switching converter to provide a stepped-down voltage output.

Figure 3A:
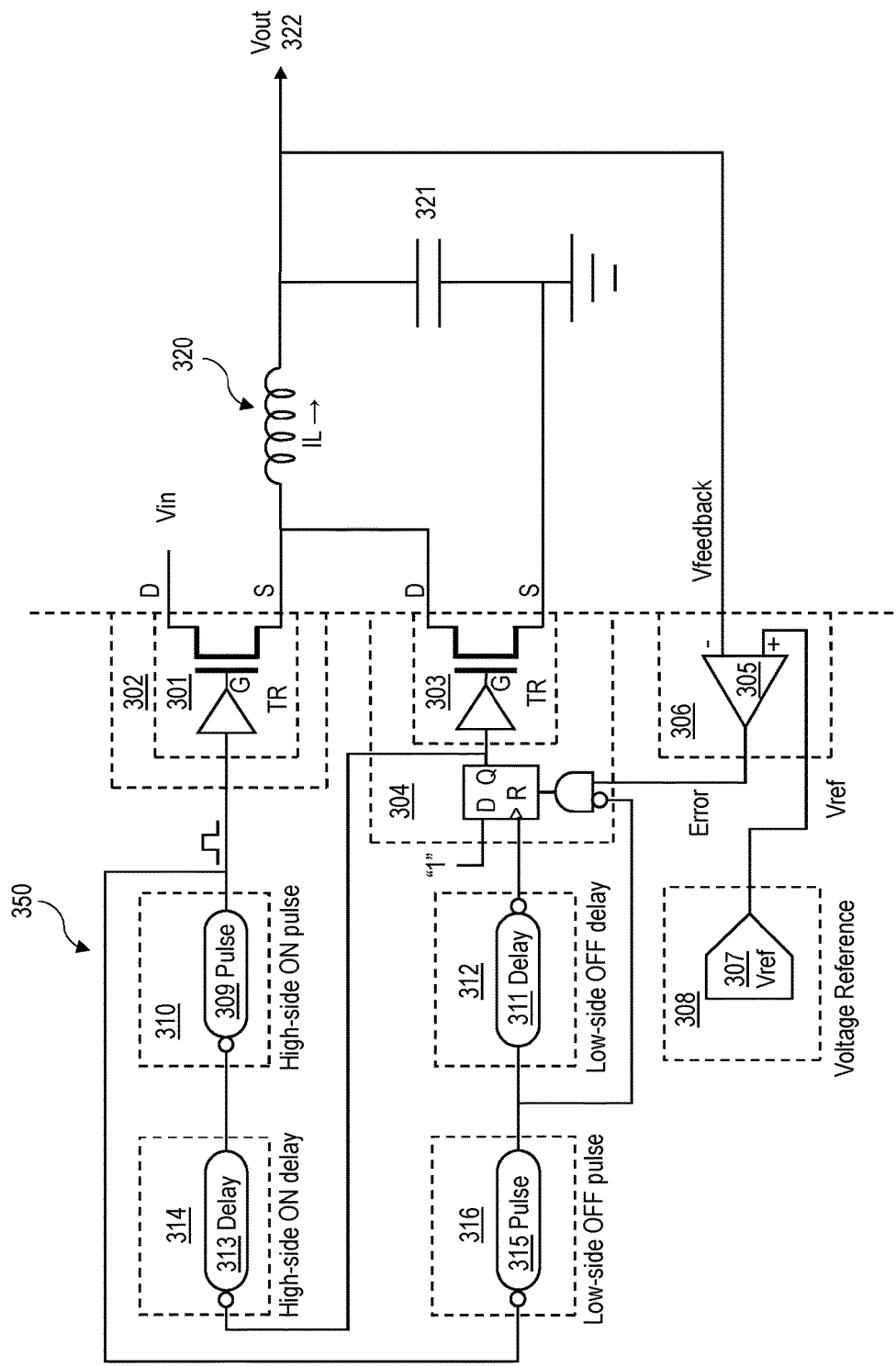
FIG. 3A illustrates a schematic diagram of an example hysteretic mode buck switching converter, according to one embodiment.
Figure 3B:
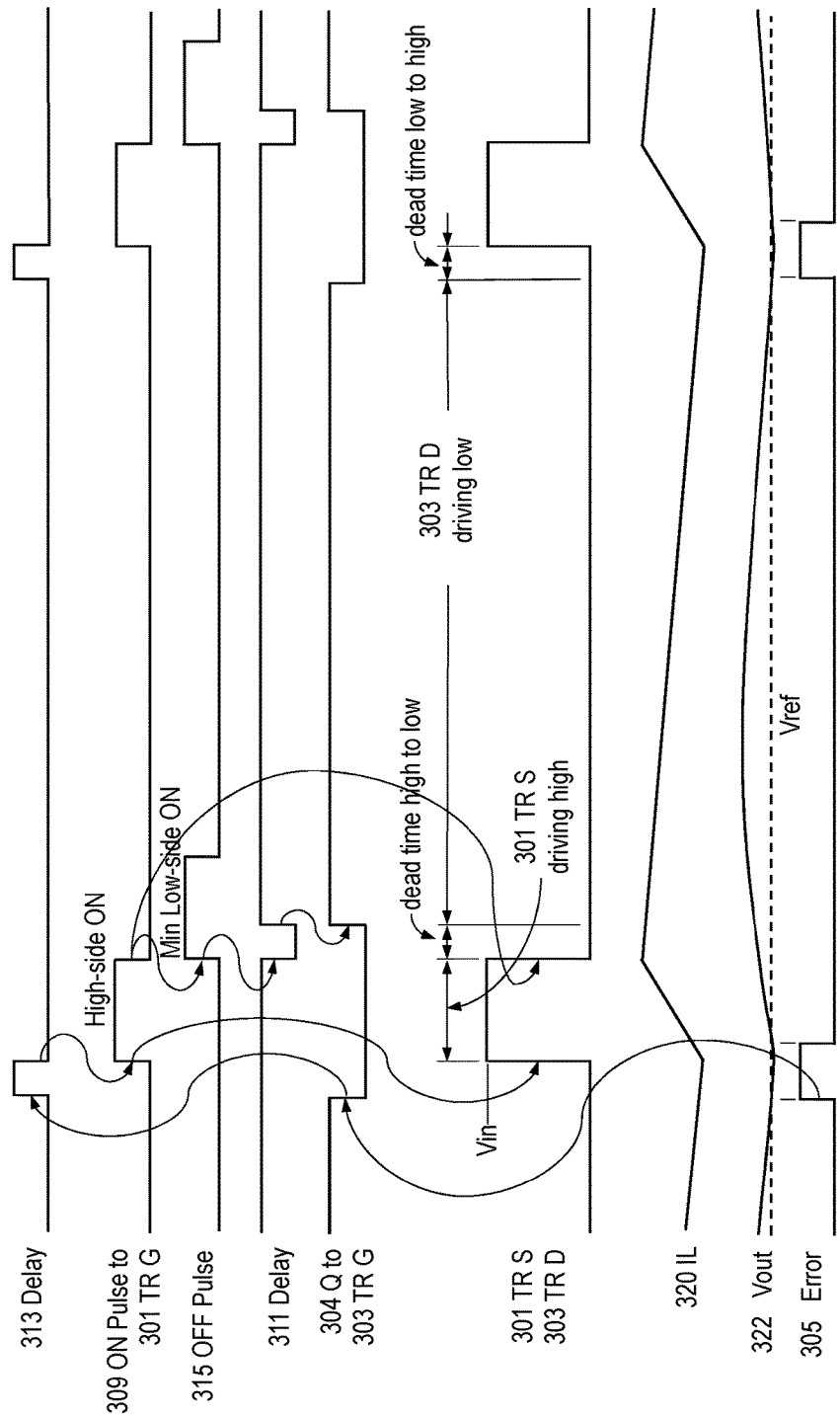
FIG. 3B is a signal diagram for the example hysteretic mode buck switching converter of FIG. 3A.

FIG. 3A illustrates a schematic diagram of an example hysteretic mode buck switching converter, according to one embodiment. The hysteretic mode buck switching converter shown in FIG. 3A may also be referred to as a bang-bang buck switching converter. FIG. 3B is a signal diagram for the example hysteretic mode buck switching converter of FIG. 3A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 301, 303, 305, 307, 309, 311, 313, and 315, each of which wrapped with respective signal wrappers 302, 304, 306, 308, 310, 312, 314, and 316. Among the adaptive blocks, the adaptive blocks 301 and 303 are high voltage power FET blocks, the adaptive block 305 is a comparator block, the adaptive blocks 309, 311, 313, and 315 are timer blocks, and the adaptive block 307 is a voltage reference block.

Each of the high voltage power FET blocks (e.g., the high voltage power FET blocks 301 and 303) can be programmed for a specific target application and configured as, for example, but not limited to, a switcher, a linear operator, a current sense, and a protector. In the present example, the high voltage power FET blocks 301 and 303 are programmed and configured as a switcher driving a high current output.

The comparator block 305 is configured to compare a voltage difference between an internal reference from the voltage reference block 307 and an external analog I/O signal $V_{feedback}$.

A timer block (e.g., the timer blocks 309, 311, 313, and 315) can be programmed to generate nanosecond, microsecond, and millisecond delays or pulses. The timer block can provide a precision dead-time control for improved efficiency. In the present example, the timer blocks 309 and 315 provide a constant-on-time pulse, and the timer blocks 311 and 313 are timers with a fixed delay specified by configuration.

A voltage reference block (e.g., the voltage reference block 307) can be used to provide a digitally-adjustable precision voltage reference. The voltage reference block can also provide protection, for example, over current protection (OCP), over voltage protection (OVP), over temperature protection (OTP), under voltage-lockout (UVLO) references. In the present example, the voltage reference block 307 provides a fixed voltage reference specified at configuration, which provides the desired output voltage, $V_{ref}$.

The high voltage power FET blocks 301 and 303 can drive the filter inductor 320 and the capacitor 321 in a synchronous mode as described in the signal diagram of FIG. 3B. The feedback voltage, $V_{feedback}$, from the filter output 322, $V_{out}$, is externally connected to the comparator block 305. The comparator block 305 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 307 interconnected with the signal wrapper 308 and the signal wrapper 306 via the programmable fabric 350.

When the error signal 305 is true, the D-type flip-flop in the signal wrapper 304 is reset to turn off the high voltage power FET block 303 and start the delay timer block 313. After this delay, the timer block 309 generates a constant-on-time pulse to turn on the high voltage power FET block 301 through the connection made with signal wrapper 310 and signal wrapper 302 via the programmable fabric 350. The high voltage power FET block 301 drives the inductor 320 to charge the output capacitor 321. When the pulse is completed, the falling edge of the pulse starts the minimum low-side ON pulse of the timer block 315 and sets the D-type flip-flop in the signal wrapper 304 after a fixed delay determined by the timer block 311 as shown in the signal diagram of FIG. 3B through the connection established with the signal wrapper 312 and the signal wrapper 304, and the connection established with the signal wrapper 310 and the signal wrapper 316 via the programmable fabric 350. The fixed delay is specified to ensure that the high-drive voltage power FET block 301 is off, dead time, before the low-drive high voltage power FET block 303 is turned on, preventing momentary shoot-through current as shown in the signal diagram of FIG. 3B. The D-type flip-flop in the signal wrapper 304 turns on the high voltage power FET block 303 driving the inductor 320 to discharge the output capacitor 321.

The next cycle begins by first tuning off the low-side high voltage power FET block 303 with a fixed delay reset pulse from the timer block 313 where the fixed delay is specified to ensure that the low-drive high voltage power FET block 303 is off, dead time, before the high-drive voltage power FET block 301 is turned on by the timer block 309, again, preventing momentary shoot-through current as shown in the signal diagram of FIG. 3B.

Figure 4:
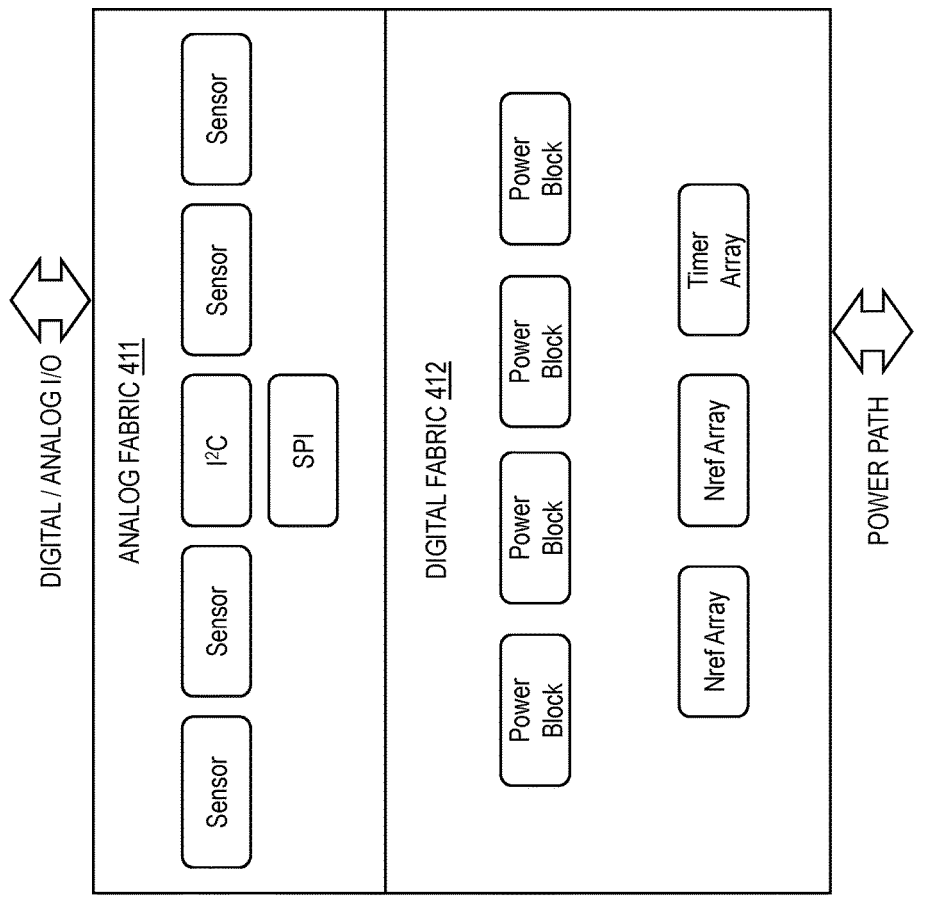
FIG. 4 shows a block diagram of an exemplary programmable logic device, according to one embodiment.

FIG. 4 shows a block diagram of an exemplary programmable logic device, according to one embodiment. The programmable fabric 101 of FIG. 1 may include an analog fabric 411 and a digital fabric 412. The analog fabric 411 corresponds to a portion of the programmable fabric 101 to provide analog interfaces with one or more external telemetry and sensor blocks, an I2C interface, an SPI interface, etc. The digital fabric 412 corresponds to a portion of the programmable fabric 101 that provides digital interfaces among the constituent blocks including the high voltage power FET blocks 103, and the digital functional blocks 105 including a voltage reference (Nref array) and a timer array. For example, the digital fabric 412 can provide a power path and the connectivity among the integrated analog blocks, digital logic elements, timer arrays, I/O blocks, etc.

It is noted that FIG. 4 is only an example of the present PLD, and it is understood that the present PLD can include any number of power and sensor blocks, for example, four, eight, and twelve power and sensor blocks, and any type of digital and/or analog I/O interfaces without deviating from the scope of the present disclosure.

The present PLD can provide a software-defined and programmable, configurable, and optimizable power MOSFET. The present PLD including software-defined, programmable, and scalable power MOSFETs can accelerate time to market optimizable for new products and standards, accelerate competitive response, lower capital expenditure, operational expenditure, and inventory. The programming and configurability of the present PLD can be easily used to implement new ideas, solutions, and topologies.

The software component of the PLD can be programmed to configure various components, elements, and functions the PLD to configure the PLD as various types of regulators, switches, muxes, battery chargers, switching controllers, gate drivers, etc. Exemplary applications of the present PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

The threshold comparator block is wrapped around by a signal wrapper that can provide an interface to the programmable fabric of the PLD using digital/analog I/Os and internal signals included in the programmable fabric. For example, the threshold comparator block is shown in FIG. 3A as the comparator block 305. After the programmable fabric and the signal wrappers of the various blocks integrated in the PLD are programmed, the PLD can serve as various power applications such as a switching converter, a linear regulator, a load switch, a sensor, a battery charger, and an external switching controller.

Figure 5A:
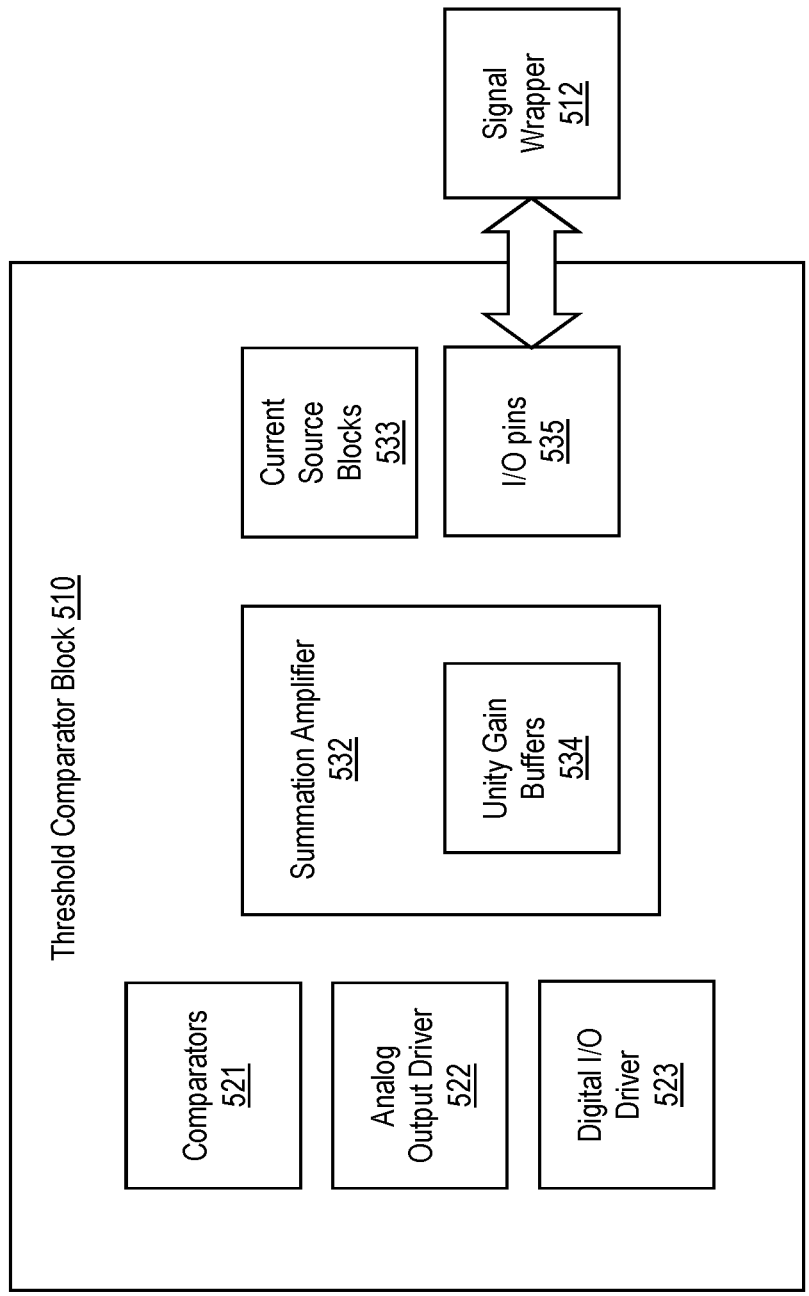
FIG. 5A shows a block diagram an example threshold comparator block, according to one embodiment.

FIG. 5A shows a block diagram an example threshold comparator block, according to one embodiment. The threshold comparator block 510 includes a plurality of comparators 521, an analog output driver 522 configured to interface with an analog fabric of the programmable fabric, a digital I/O driver 523 configured to interface with a digital fabric of the programmable fabric, a summation amplifier 532 including one or more unity gain buffers 534, current source blocks 533, and I/O pins 535. For example, the threshold comparator block 510 is the comparator block 305 that is wrapped around by the signal wrapper 306 and integrated in the PLD as shown in FIG. 3A. The analog output driver 522 can configure one or more pins included in the I/O pins 535 to interface with other blocks integrated in the PLD via the signal wrapper 512. The digital I/O driver 523 can configure the digital I/O pins of the I/O pins 535 to interface with the programmable fabric of the PLD.

Figure 5B:
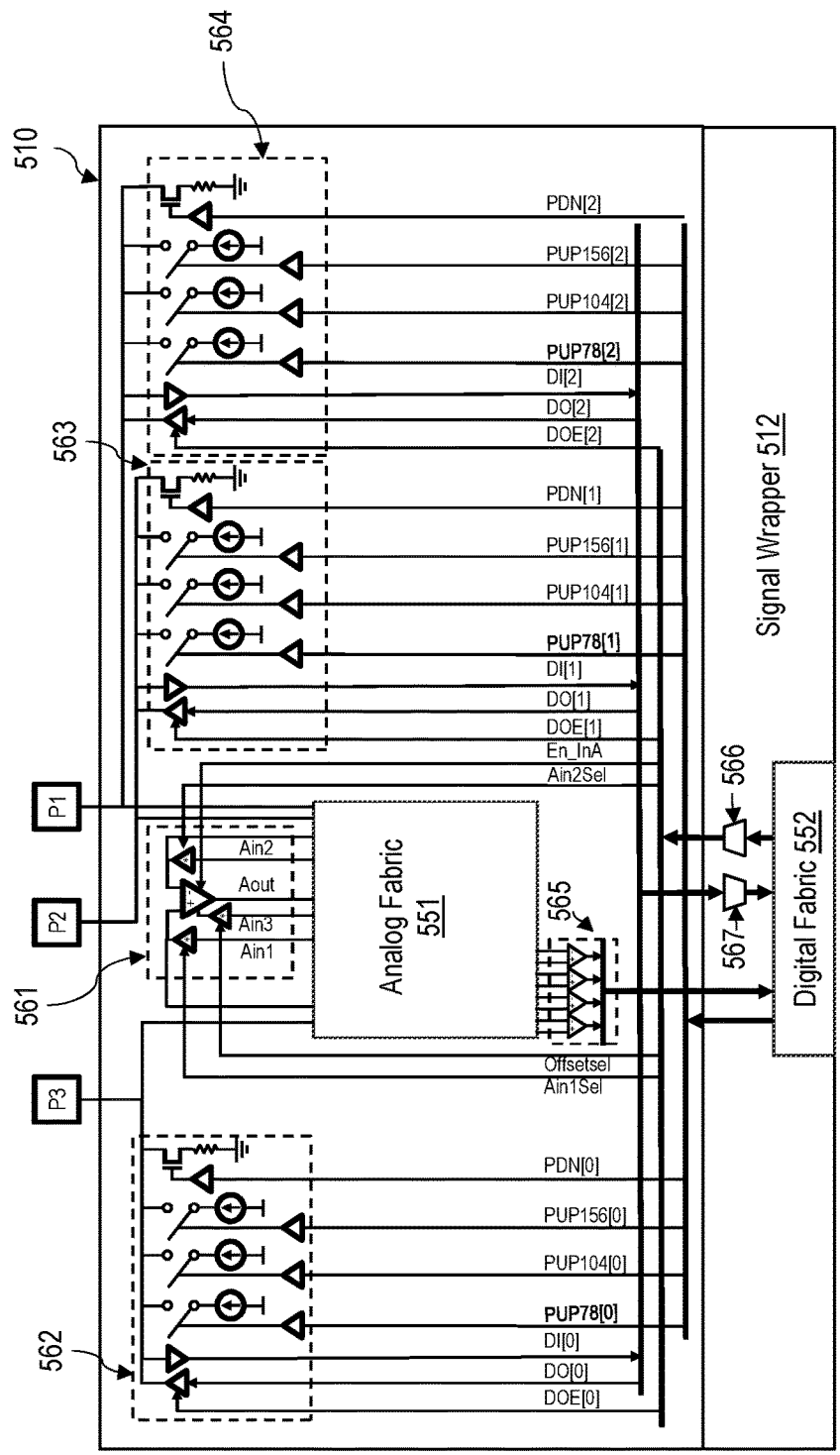
FIG. 5B shows a circuit diagram of an example threshold comparator block, according to one embodiment.

FIG. 5B shows a circuit diagram of an example threshold comparator block, according to one embodiment. The threshold comparator block 510 includes a summation amplifier 561, three current source blocks 562, 563, and 564, and four comparators 565. It is noted that the circuit diagram shown in FIG. 5B is only an example, and the threshold comparator block 510 can include any number of summation amplifiers, current source blocks and comparators without deviating from the scope of the present disclosure. The threshold comparator block 510 interfaces with the programmable fabric including the analog fabric 551 and the digital fabric 552 via the signal wrapper 512. The signal to and from the digital fabric 552 may be buffered using input and output buffers 566 and 567. In addition, each of the current source blocks 562, 563, and 564 is connected to its corresponding pads P1, P2, and P3 to provide external interface connections where bonding wires are attached. The pads P1, P2, and P3 may be on the I/O pins 535 of FIG. 5A.

Figures 6A, 6B:
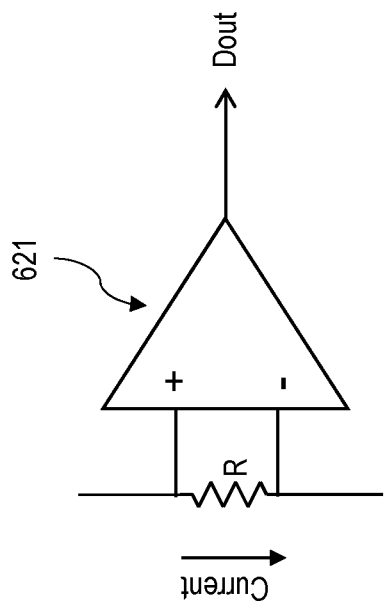
FIG. 6A shows a symbolic block diagram of an example comparator included in the threshold comparator block, according to one embodiment.
FIG. 6B shows an example comparator configured as a current direction detector, according to one embodiment.

FIG. 6A shows a symbolic block diagram of an example comparator included in the threshold comparator block, according to one embodiment. Herein, the comparator 621 is also referred to as a differential threshold comparator. The comparator 621 provides an error signal by comparing two analog input signals, Ain1 and Ain2. In the example of a power regulator, the two input signals Ain1 and Ain2 are reference voltage and feedback voltage signals, $V_{ref}$ and $V_{feedback}$. Depending on an application and an intended functionality, the comparator 621 can be configured as various types of analog signal comparators including, but not limited to, a current comparator and a voltage comparator. The characteristics and the interconnection of internal components within the comparator 621 can be programmably controlled by programming the signal wrapper (e.g., signal wrapper 512 of FIG. 5A).

Referring to FIG. 6A, the comparator 621 can have two analog inputs Ain1 and Ain2 and one digital output Dout. The digital output Dout can be a flag signal indicating which of the two analog inputs Ain1 and Ain2 is bigger. For example, the digital out Dout is a one-bit signal indicating true (1) if Ain1 is bigger that Ain2, and false (0) if Ain2 is bigger than Ain1. If the two analog inputs Ain1 and Ain2 are substantially equal, the digital output Dout can be a metastable floating output indicating either true or false. Referring to FIG. 4, each sensor block in the analog fabric 411 of the PLD can have more than one threshold comparator blocks therein. An analog input generated or received from the sensor block can be fed to the threshold comparator as an analog input (e.g., Ain2) to compare with a refence analog input (e.g., Ain1).

According to one embodiment, the analog inputs Ain1 and Ain2 to the comparator 621 can be external analog signals that are received via I/O blocks (e.g., 102 of FIG. 1) or analog reference signals that are generated by one of the blocks included in the digital fabric (e.g., the digital fabric 412 of FIG. 4). For example, analog reference signals that are input to the comparator 621 may be provided by a signal generator integrated within the PLD such as a noise-immune reference block (e.g., Nref Array shown in FIG. 4). The analog input signals Ain1 and Ain2 may be current signals Ain1 and Ain2.

FIG. 6B shows an example comparator configured as a current direction detector, according to one embodiment. The comparator 621 can be configured to determine a current direction across a current detection resistor R. For example, if the direction of the current is positive, the digital output Dout is true (1), otherwise the digital output Dout is false (0).

According to another embodiment, the comparator 621 can be used for generating a telemetry signal from a sensor block integrated in the PLD. For example, the comparator 621 can generate a warning or protection signal such as over-current protection (OCP), over-voltage protection (OVP), and over-temperature protection (OTP) signals by comparing an input signal (e.g., a sensor signal) from the sensor block against a reference (current, voltage, or temperature) signal.

According to yet another embodiment, the comparator 621 can be used to control the PLD configured as a converter in various operational modes. For example, the converter can operate in a voltage/current mode, a constant on-time (COT) mode, and a constant off-time (COF) mode. The voltage/current mode requires a loop compensation to achieve a stable operation at a wide range of input voltage range. For example, the constant on-time control uses the output ripple as a PWM ramp signal to compare with a reference voltage to regulate the voltage of the converter.

Figure 7A:
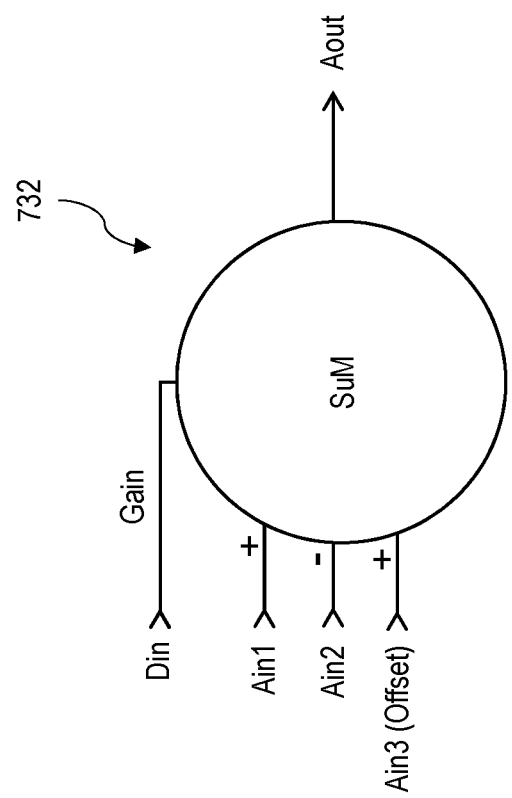
FIG. 7A shows a symbolic diagram of a summation amplifier, according to one embodiment.

FIG. 7A shows a symbolic diagram of a summation amplifier, according to one embodiment. The summation amplifier 732 can be configured by programming the programmable fabric of the PLD and the signal wrapper of the threshold comparator block. The summation amplifier 732 can have three analog inputs Ain1, Ain2, and Ain3 for an offset, a digital input Din for a gain, and an analog output Aout. The analog output Aout is calculated by the equation:

$$A\text{out}=\text{Gain}*(A\text{in}1-A\text{in}2)+\text{Offset}.$$

Figure 7B:
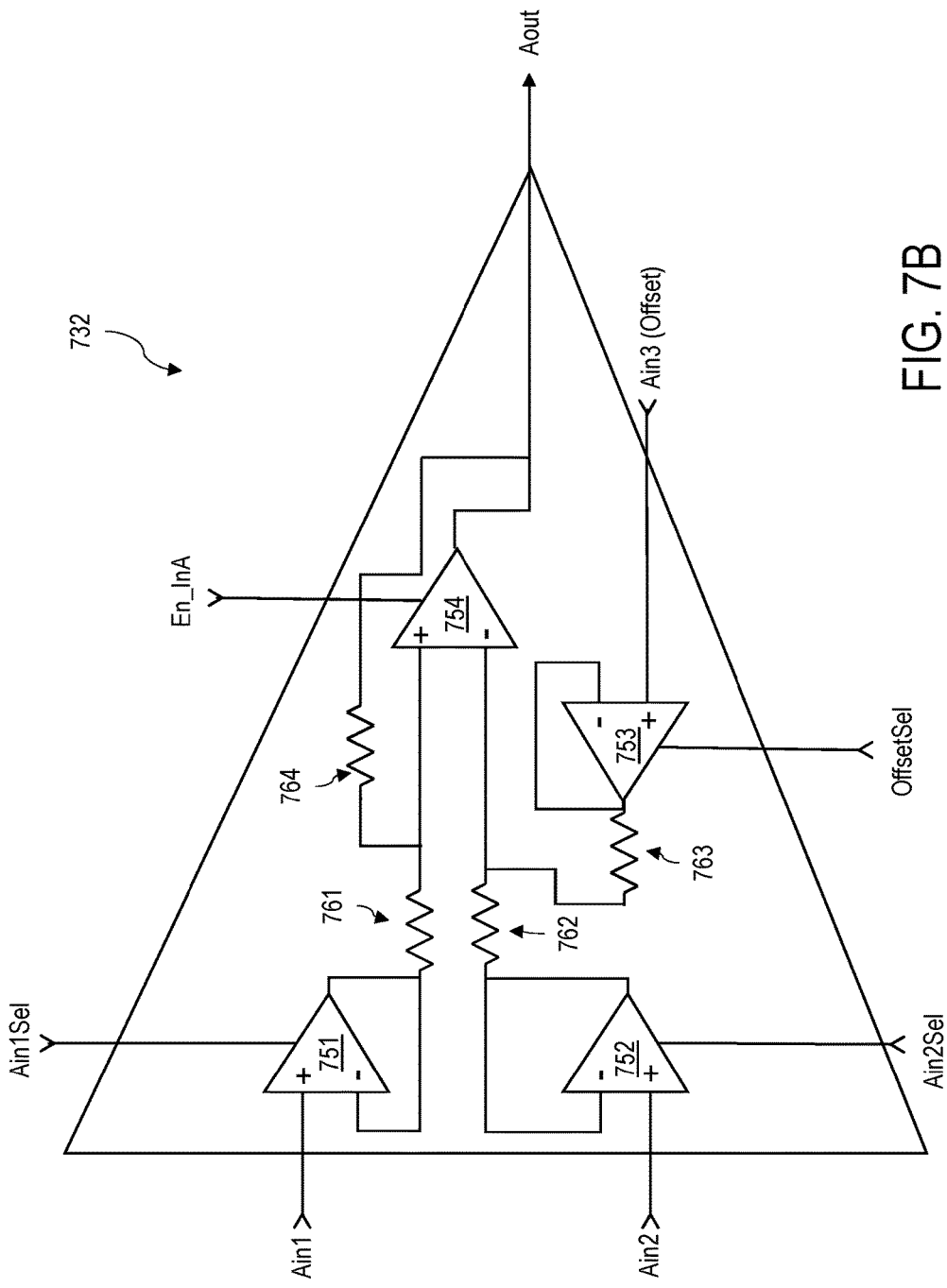
FIG. 7B shows a simplified circuit diagram of the summation amplifier of FIG. 7A.

FIG. 7B shows a simplified circuit diagram of the summation amplifier of FIG. 7A. The summation amplifier 732 includes four amplifiers 751, 752, 753, and 754, and three of the amplifiers 751, 752, and 753 can be configured as unity gain buffers. Each of the unity gain buffers 751, 752, and 753 can be independently selected (or enabled) using the respective select or enable signals Ain1Sel, Ain2Sel, and OffsetSel. The analog input signals Ain1 and Ain2 are fed to the unity gain buffers 751 and 752, and the difference between the analog input signals Ain1 and Ain2 is multiplied by a digital gain. According to one embodiment, the digital gain is selected from a predetermined set of values, for example, {65, 32, 15.5, 4.07, 2, 1} using a multiplexer (not shown). Depending on an input received from the programmable fabric, the multiplexers can change a ratio between the resistors 761 and 764, and between the resistors 762 and 764 to adjust the gain of the summation amplifier 732. The product of the difference of the input signals and the digital gain is added with an analog offset signal Ain3 to generate the analog output signal Aout.

Figure 8:
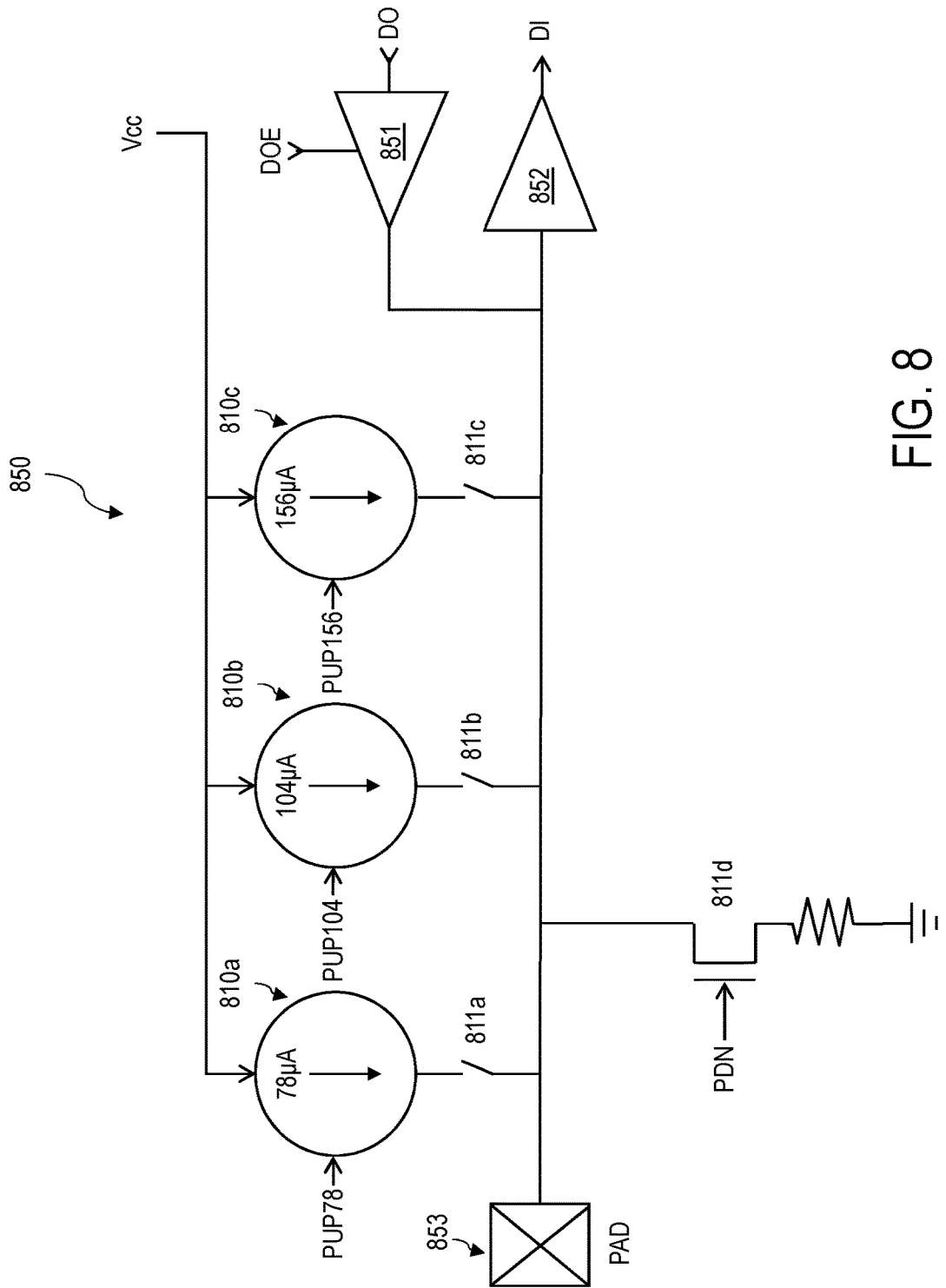
FIG. 8 shows a simplified circuit diagram of example GPIO interface of the threshold comparator block, according to one embodiment.

According to one embodiment, the threshold comparator block can be configured to provide a GPIO interface. FIG. 8 shows a simplified circuit diagram of GPIO interface of the threshold comparator block, according to one embodiment. The I/O signals to the GPIO interface can be digital, analog, or a combination of digital and analog signals.

According to one embodiment, the GPIO interface 850 can be configured as a universal serial bus (USB) 3.0 type-C driver. The GPIO interface 850 includes three current source blocks 810a, 810b, and 810c. The current source blocks 810a, 810b, 810c are connected to a PAD 853 of the USB driver and are switched on or off using the corresponding switches 811a, 811b, 811c, and 811d for USB signaling. For example, the switch 811d is connected to a 5.1 kOhm pull-down resistor to ground. Input signals PUP78, PUP104, PUP156, and PDN control the switches 811a, 811b, 811c, and 811d. Vcc is an input voltage signal that may vary depending on the USB specification, for example, 3.3V and 5V. The signal DO is received from the programmable fabric via a buffer 851, and the signal DI is output to the digital fabric via a buffer 852. In one embodiment, the signal DO can be an open drain signal. The open drain signal can be implemented by holding the OD signal low. When the signal DOE is high, the output pad 953 is forced to be low. When the signal DOE is low, the output pad 853 is hi-Z floating in an open drain state. This feature is useful in wire-ORing bus I/O interface applications. TABLE 1 shows an example pull-up current table for the GPIO interface 850 configured as a USB 3.0 type-C driver.

TABLE 1

|  | Vcc (V) | Rp3 (KΩ) | Rp2 (KΩ) | Rp1 (KΩ) | Rd (KΩ) |
| --- | --- | --- | --- | --- | --- |
| USB Spec | 3.3 | 36 | 12 | 4.7 | 5.1 |
| USB Spec | 5 | 56 | 22 | 10 | 5.1 |
| Output Current | — | 80 μA | 180 μA | 330 μA | — |

The digital output signals of the USB driver can be 1.8V to 3.3V, +/−8 mA. Table 2 is a pull-up current table. The current values represent currents to be supplied to the USB for determining the USB protocol.

TABLE 2

| PUP78[x] | PUP104[x] | PUP156[x] | Value (μA) |
| --- | --- | --- | --- |
| 0 | 0 | 0 | 0 |
| 1 | 0 | 0 | 78 |
| 0 | 1 | 0 | 104 |
| 1 | 1 | 0 | 182 |
| 0 | 0 | 1 | 156 |
| 1 | 0 | 1 | 234 |
| 0 | 1 | 1 | 260 |
| 1 | 1 | 1 | 338 |

Figure 9:
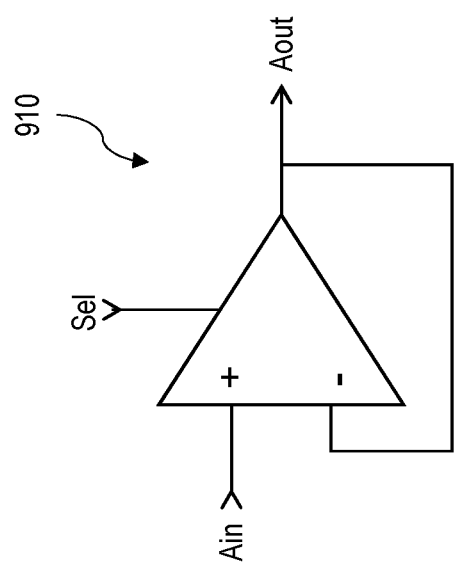
FIG. 9 is a symbolic diagram of a unity gain buffer of the threshold comparator block, according to one embodiment.

FIG. 9 is a symbolic diagram of a unity gain buffer of the threshold comparator block, according to one embodiment. The unity gain buffer 910 can be included in the summation amplifier of the threshold comparator block as shown in FIG. 5A. In some embodiments, the unity gain buffer 910 can be included in the analog fabric of the PLD. The unity gain buffer 910 receives an analog input signal Ain from the programmable fabric and generates an analog output signal Aout by buffering the input signal Ain. The output of the unity gain buffer 910 can be selected using a select signal that is also received from the programmable fabric.

Figure 10B:
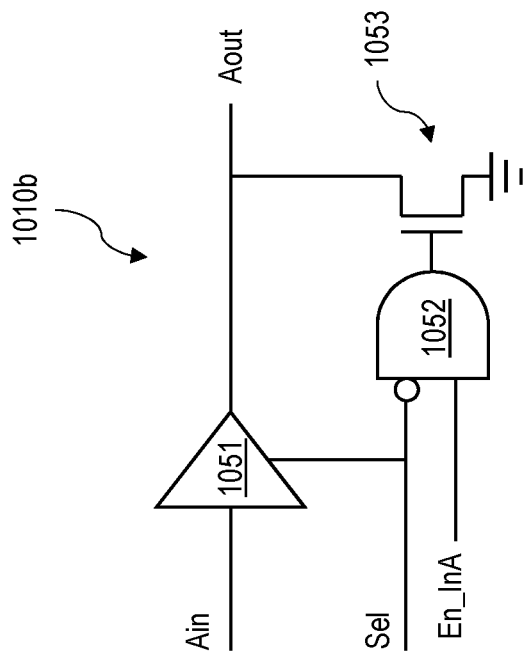
FIG. 10B shows an equivalent circuit diagram of the unity gain buffer of FIG. 10A including an enabling logic, according to one embodiment.
Figure 10A:
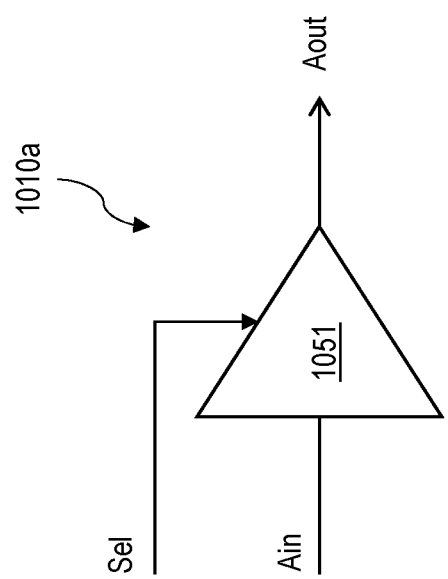
FIG. 10A shows a simplified circuit diagram of an I/O pin driver of the threshold comparator block, according to one embodiment.

FIG. 10A shows a simplified circuit diagram of an I/O pin driver of the threshold comparator block, according to one embodiment. FIG. 10B shows an equivalent circuit diagram of the unity gain buffer of FIG. 10A including an enabling logic, according to one embodiment. The I/O pin driver 1010a drives the analog input signal Ain to the analog output signal Aout. The I/O pin driver 1010b has an enable/disable functionality of the unity gain buffer as directed by a signal En_InA received from the programmable fabric. In one embodiment, the threshold comparator block can be configured as a unity gain voltage follower.

A threshold comparator block integrated in a programmable logic device (PLD) is disclosed. The threshold comparator block includes: one or more signal comparators configured to receive two analog input signals and provide a digital output signal indicating a comparison result of the two analog input signals; an analog output driver configured to interface with an analog fabric of a programmable fabric of the PLD; a digital input/output (I/O) driver configured to interface with a digital fabric of the programmable fabric of the PLD; and I/O pins configured to provide an interface with a signal wrapper to interface analog and digital signals between the analog output driver and the digital I/O driver and the programmable fabric. The threshold comparator block is configured to interface with one or more adaptive blocks integrated in the PLD via the programmable fabric and the signal wrapper.

The digital output signal of the one or more signal comparators may indicate a current direction between the two analog input signals.

The threshold comparator block may further include a summation amplifier configured to receive a plurality of analog input signals including a first analog signal and a second analog signal, and a digital gain input and provide an analog output signal corresponding to a difference between the first analog signal and the second analog signal multiplied by the digital gain input.

The plurality of analog input signals may further include a third analog signal, and the third analog signal may be added to the analog output signal using the summation amplifier.

The threshold comparator block may further include one or more multiplexers coupled to a plurality of resistors. The one or more multiplexers may be configured to receive the digital gain input and adjust a digital gain of the summation amplifier by changing a ratio of the plurality of resistors.

The threshold comparator block may further include one or more current source blocks configured to provide a universal serial bus (USB) driver.

The one or more current source blocks may be connected to a respective pad of the USB driver and are switched on or off using the corresponding switches for USB signals.

The USB signals may be received via the signal wrapper.

According to another embodiment, a programmable logic device (PLD) includes: a threshold comparator block; a programmable fabric; and a signal wrapper configured to provide signals between the threshold comparator block and the programmable fabric. The threshold comparator block includes: one or more signal comparators configured to receive two analog input signals and provide a digital output signal indicating a comparison result of the two analog input signals; an analog output driver configured to interface with an analog fabric of the programmable fabric; a digital input/output (I/O) driver configured to interface with a digital fabric of the programmable fabric; and I/O pins configured to provide an interface with the signal wrapper to interface analog and digital signals between the analog output driver and the digital I/O driver and the programmable fabric. The threshold comparator block is configured to interface with one or more adaptive blocks integrated in the PLD via the programmable fabric and the signal wrapper.

The above example embodiments have been described hereinabove to illustrate various embodiments of implementing a system and method for providing a scalable metal-oxide-semiconductor field-effect transistor (MOSFET) block integrated in a PLD. Various modifications and departures from the disclosed example embodiments will occur to those having ordinary skill in the art. The subject matter that is intended to be within the scope of the invention is set forth in the following claims.

What is claimed is:

1. A threshold comparator block integrated in a programmable logic device (PLD) comprising:
   one or more signal comparators configured to receive two analog input signals and provide a digital output signal indicating a comparison result of the two analog input signals;
   an analog output driver configured to interface with an analog fabric of a programmable fabric of the PLD;
   a digital input/output (I/O) driver configured to interface with a digital fabric of the programmable fabric of the PLD; and
   I/O pins configured to provide an interface with a signal wrapper to interface analog and digital signals between the analog output driver and the digital I/O driver and the programmable fabric,
   wherein the threshold comparator block is configured to interface with one or more adaptive blocks integrated in the PLD via the programmable fabric and the signal wrapper.

2. The threshold comparator block of claim 1, wherein the digital output signal of the one or more signal comparators indicates a current direction between the two analog input signals.

3. The threshold comparator block of claim 1, further comprising a summation amplifier configured to receive a plurality of analog input signals including a first analog signal and a second analog signal, and a digital gain input and provide an analog output signal corresponding to a difference between the first analog signal and the second analog signal multiplied by the digital gain input.

4. The threshold comparator block of claim 3, wherein the plurality of analog input signals further includes a third analog signal, and the third analog signal is added to the analog output signal using the summation amplifier.

5. The threshold comparator block of claim 3, further comprising one or more multiplexers coupled to a plurality of resistors, wherein the one or more multiplexers are configured to receive the digital gain input and adjust a digital gain of the summation amplifier by changing a ratio of the plurality of resistors.

6. The threshold comparator block of claim 1, further comprising one or more current source blocks configured to provide a general-purpose input/output (GPIO) interface.

7. The threshold comparator block of claim 6, wherein I/O signals of the GPIO interface is analog, digital, or a combination of analog and digital signals.

8. The threshold comparator block of claim 6, wherein the GPIO interface is implemented as a universal serial bus (USB) driver.

9. The threshold comparator block of claim 8, wherein the one or more current source blocks are connected to a respective pad of the USB driver and are switched on or off using the corresponding switches for USB signals.

10. The threshold comparator block of claim 9, wherein the USB signals are received via the signal wrapper.

11. A programmable logic device (PLD) comprising:
    a threshold comparator block;
    a programmable fabric; and
    a signal wrapper configured to provide signals between the threshold comparator block and the programmable fabric, wherein the threshold comparator block comprising:
  one or more signal comparators configured to receive two analog input signals and provide a digital output signal indicating a comparison result of the two analog input signals;
  an analog output driver configured to interface with an analog fabric of the programmable fabric;
  a digital input/output (I/O) driver configured to interface with a digital fabric of the programmable fabric; and
  I/O pins configured to provide an interface with the signal wrapper to interface analog and digital signals between the analog output driver and the digital I/O driver and the programmable fabric,
wherein the threshold comparator block is configured to interface with one or more adaptive blocks integrated in the PLD via the programmable fabric and the signal wrapper.

* * * * *